US010539601B2

(12) United States Patent
Lu et al.

(10) Patent No.: US 10,539,601 B2
(45) Date of Patent: Jan. 21, 2020

(54) TEMPERATURE COMPENSATION OF INSULATION MONITORING FOR ROTATING MACHINES

(71) Applicant: General Electric Company, Schenectady, NY (US)

(72) Inventors: Dan Tho Lu, Minden, NV (US); Ronald W. Wilson, Minden, NV (US)

(73) Assignee: General Electric Company, Schenectady, NY (US)

( * ) Notice: Subject to any disclaimer, the term of this patent is extended or adjusted under 35 U.S.C. 154(b) by 206 days.

(21) Appl. No.: 15/714,788

(22) Filed: Sep. 25, 2017

(65) Prior Publication Data
US 2018/0011133 A1   Jan. 11, 2018

Related U.S. Application Data

(62) Division of application No. 14/073,752, filed on Nov. 6, 2013, now Pat. No. 9,772,364.

(51) Int. Cl.
*G01R 31/02* (2006.01)
*G01R 31/34* (2006.01)
*G01R 35/00* (2006.01)
*G01R 19/32* (2006.01)

(52) U.S. Cl.
CPC ......... *G01R 31/024* (2013.01); *G01R 31/346* (2013.01); *G01R 35/00* (2013.01); *G01R 19/32* (2013.01)

(58) Field of Classification Search
None
See application file for complete search history.

(56) References Cited

U.S. PATENT DOCUMENTS

| 5,510,687 A | 4/1996 | Ursworth et al. |
| 7,042,229 B2 | 5/2006 | Lee et al. |
| 9,255,970 B2 | 2/2016 | Neti et al. |
| 9,347,837 B2 | 5/2016 | Kirkpatrick et al. |
| 9,772,364 B2 * | 9/2017 | Lu .................. G01R 31/024 |
| 2005/0218906 A1 | 10/2005 | Younsi et al. |
| 2006/0126250 A1 | 6/2006 | Sychra et al. |
| 2008/0067970 A1 | 3/2008 | Qian et al. |
| 2009/0243524 A1 | 10/2009 | Katayama et al. |
| 2011/0050141 A1 | 3/2011 | Yeh et al. |
| 2014/0358391 A1 | 12/2014 | Kakihara |
| 2015/0123671 A1 | 5/2015 | Yannam et al. |
| 2015/0212159 A1 | 7/2015 | Lu |
| 2016/0118867 A1 | 4/2016 | Iwata et al. |

\* cited by examiner

*Primary Examiner* — Jermele M Hollington
(74) *Attorney, Agent, or Firm* — Mintz Levin Cohn Ferris Glovsky and Popeo, P.C.

(57) ABSTRACT

A system includes a monitoring and/or protection system that includes an insulation derivation circuit. The insulation derivation circuit is configured to derive a first temperature compensation curve based on a first temperature and a first current, and the monitoring and/or protection system is configured to communicatively couple to a first current sensor configured to sense the first current traversing a first phase of a stator winding of a motor, a generator, or a combination thereof. The insulation derivation circuit is also configured to communicatively couple to a first temperature sensor configured to sense the first temperature of the stator when the stator is energized, and the temperature compensation curve is configured to map a temperature to a leakage dissipation factor.

19 Claims, 3 Drawing Sheets

TEMPERATURE COMPENSATION OF INSULATION MONITORING FOR ROTATING MACHINES

CROSS REFERENCE TO RELATED APPLICATION

The present application is a divisional application of U.S. patent application Ser. No. 14/073,752, entitled "TEMPERATURE COMPENSATION OF INSULATION MONITORING FOR ROTATING MACHINES," filed Nov. 6, 2013, now U.S. Pat. No. 9,772,364 which issued on Sep. 26, 2016, the entirety of which is incorporated by reference herein for all purposes.

BACKGROUND

The subject matter disclosed herein relates to monitoring insulation of the windings within electrical machines.

Certain electrical machinery, such as generators or motors, utilize windings of metal in order to convert mechanical rotation into electrical energy, or vice versa. Each winding is insulated by one or more layers of insulation to prevent electrical shorts, minimize leakage current, and increase durability. As the electrical machine is used, the winding insulation may naturally degrade, and at some point may be replaced or repaired (e.g., serviced). Servicing the windings may take an undesired time, and increase operating expenses. Thus, it is best to service the winding insulation only when the insulation has reached a certain point of degradation. Monitoring the material health of the insulation of individual windings to determine when to service the insulation, however, can be difficult. Each winding may be exposed to unique operating conditions that may affect the rate at which the insulation is degraded. Accounting for differences in operating conditions (e.g., temperature, environmental conditions, insulation material) may be difficult.

BRIEF DESCRIPTION

Certain embodiments commensurate in scope with the originally claimed invention are summarized below. These embodiments are not intended to limit the scope of the claimed invention, but rather these embodiments are intended only to provide a brief summary of possible forms of the invention. Indeed, the invention may encompass a variety of forms that may be similar to or different from the embodiments set forth below.

In a first embodiment, a system includes a monitoring and/or protection system that includes an insulation derivation circuit. The insulation derivation circuit is configured to derive a first temperature compensation curve based on a first temperature and a first current, and the monitoring and/or protection system is configured to communicatively couple to a first current sensor configured to sense the first current traversing a first phase of a stator winding of a motor, a generator, or a combination thereof. The insulation derivation circuit is also configured to communicatively couple to a first temperature sensor configured to sense the first temperature of the stator when the stator is energized, and the temperature compensation curve is configured to map a temperature to a leakage dissipation factor.

In a second embodiment, an apparatus includes a non-transitory computer readable medium comprising instructions configured to derive an original current measurement based on a signal traversing a first phase of a stator winding of a motor, a generator, or a combination thereof. The instructions are also configured to derive an original temperature measurement based on a temperature signal from a temperature sensor disposed in the stator and configured to sense temperature when the stator is energized, and are configured to derive an original insulation condition based on the original current measurement and the original temperature measurement.

In a third embodiment, a method includes deriving an original current measurement based on a signal traversing a first phase of a stator winding of a motor, a generator, or a combination thereof. The method also includes deriving an original temperature measurement based on a temperature signal from a temperature sensor disposed in the stator and configured to sense temperature when the stator is energized and includes deriving an original insulation condition based on the original current measurement and the original temperature measurement.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
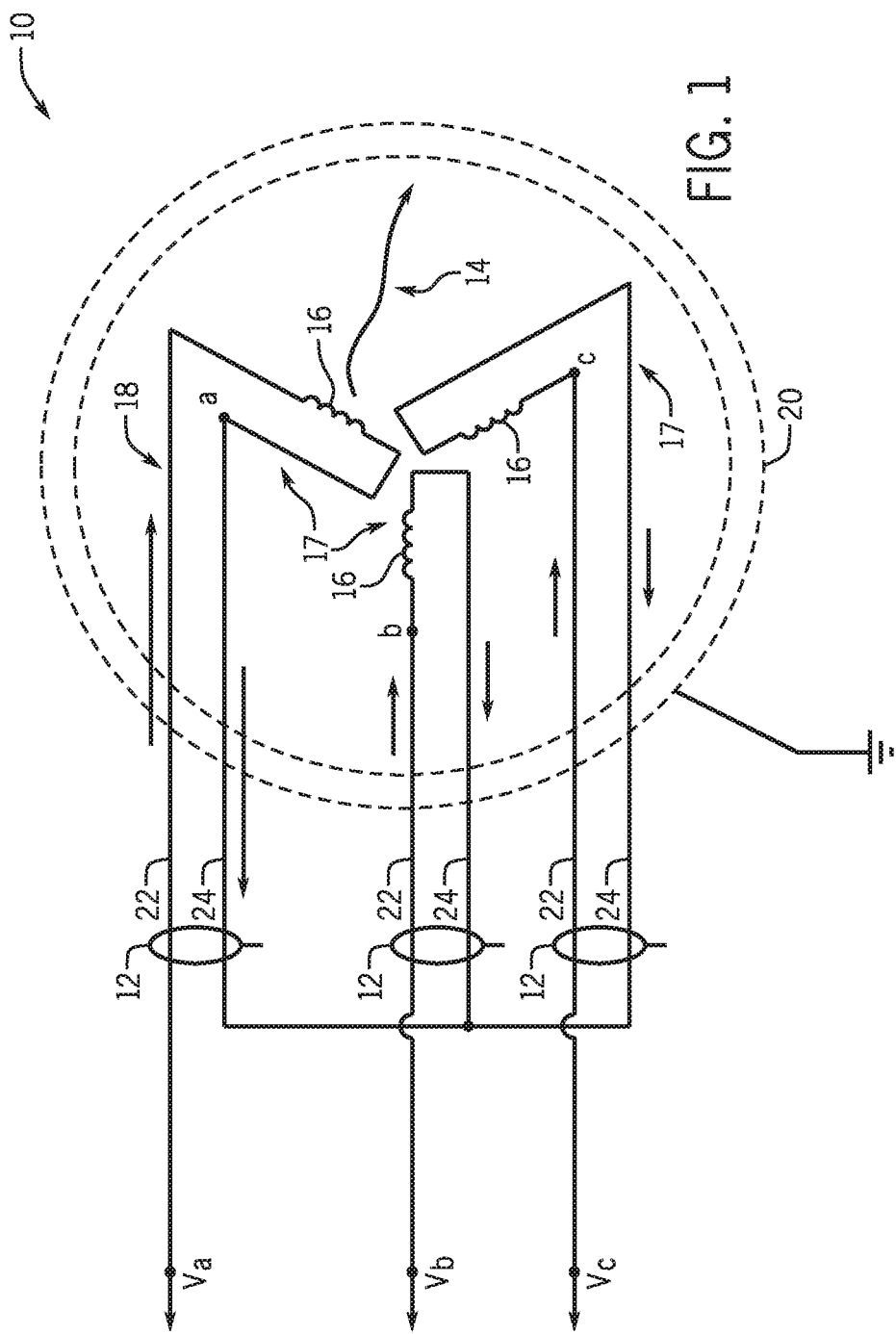
FIG. 1 is a schematic diagram of an embodiment of a rotating machine that has sensors to monitor leakage current within the windings.

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

The present disclosure is directed at techniques useful in deriving conditions of certain equipment, such as stator windings, by monitoring and/or analyzing certain operating conditions, such as insulation leakage current over certain fixed or variable time spans. The windings include insulation between each of the layers which may degrade over the natural life of the machine. It is useful to know when the insulation has changed enough to require replacement of the winding in the machine, and/or to provide for more accurate information on machine performance. The techniques described herein include sensors that communicate with a machine monitoring and/or protection system, and processes executable by the machine monitoring and/or protection system useful in deriving equipment wear and tear, such as insulation degradation, based on the sensor data. The monitoring and/or protection system may be programmed with pre-set degradation scales depending on the material of the winding insulation. That is, each insulation material will have a tested amount of leakage current that escapes depending on how far the insulation has degraded. In addition, for windings insulated with an unknown material, the monitoring and/or protection system may learn the characteristics of the winding with regard to the temperature dependent leakage current. The monitoring and/or protection system may learn the characteristics, for example, by measuring certain line voltages, leakage currents, and/or temperatures. Data measurements may be stored and/or processed dynamically to calculate a compensation model. The model may be updated several times over the life of the machine. The initial compensation model may establish a baseline measurement useful in deriving a desired normalization temperature range. Additional models may update the measurement over an expanded range of temperatures. The monitoring and/or protection system may then implement temperature compensation for the on-line measurements after the learning period, which may give more detailed conditions of wear and tear of equipment.

FIG. 1 is a schematic diagram of an embodiment of a rotating machine 10 that includes sensors 12 to monitor a leakage current 14, for example, to determine insulation condition within the windings 16 of a stator 18. The windings 16 are organized into phases 17 disposed within the housing 20 of the machine 10. As illustrated, the stator 18 may include three phases 17, but in other embodiments the stator 18 may contain more or fewer phases 17. The phases 17 may be arranged in a delta configuration, a wye configuration, or some other configuration. The rotating machine 10 in most instances will be either a motor or a generator. In the instance where the machine 10 is a motor, current is conveyed from an external source to the machine/motor 10 at the connections (e.g., connection $V_a$, $V_b$, $V_c$) where it passes through the windings 16. The windings 16 generate a magnetic field that is used to turn a rotor useful in providing rotational force. In the instance where the machine 10 is a generator, a mechanical torque is conveyed to a magnet which rotates inside the windings 16, generating a voltage at the connections (e.g., connection $V_a$, $V_b$, $V_c$). During operation of the machine 10, imperfect conditions of the windings 16 (among other things) may allow leakage current 14 to be diverted from the circuitry of the windings 16. For example, the leakage current 14 may traverse to ground, e.g., the housing 20, which is grounded. The coils of each of the windings 16 are lined with insulation to separate electrically conducting conduits and to minimize the leakage current 14.

The leakage current 14, in the illustrated embodiment, may be detected by sensors 12. For example, the sensors 12 may include various sensor types described in more detail below, configured to monitor the ingoing current 22 from the connection (e.g., connection $V_a$, $V_b$, $V_c$) and the outgoing current 24 after the current has passed through the windings 16. The sensors 12 may be placed anywhere along the circuit including a few centimeters from the housing 20 to several hundred meters away from the housing 20. It may be useful to place the sensors 12 near the housing 20 (or inside the housing 20) to measure specifically the amount of leakage current 14 that is leaking from the windings 16.

Figure 3:
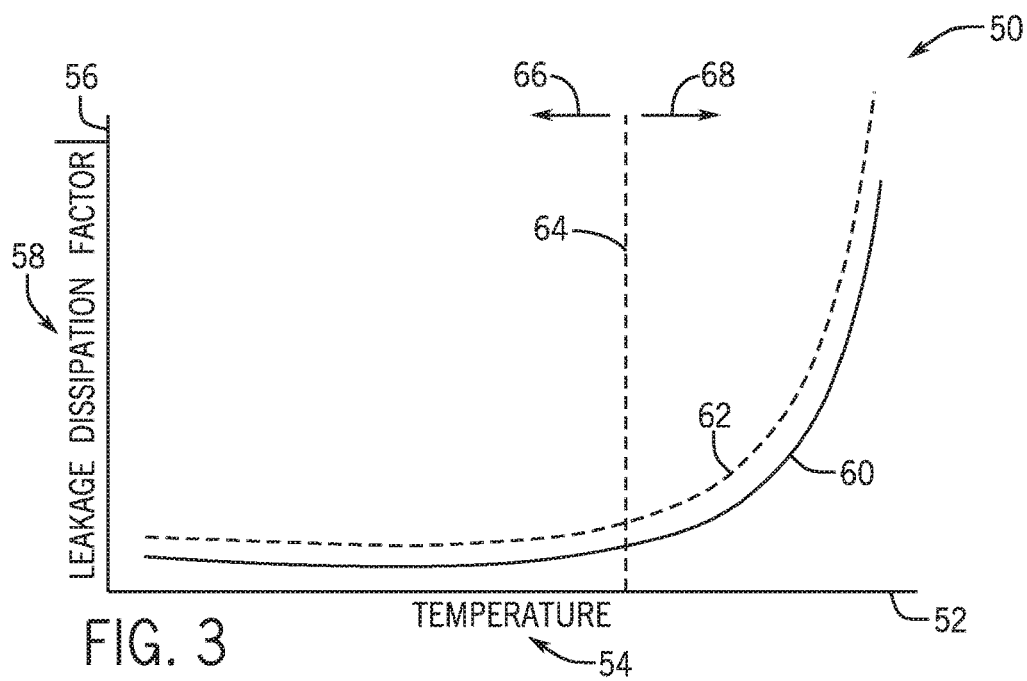
FIG. 3 is a graphical embodiment of a compensation curve that may be used to determine the amount of degradation of the insulation.

The leakage current 14 depends on a number of factors that, in relation to each other, may be used to determine the condition of the insulation. Factors include, for example, insulation material, age, and the operating conditions (e.g., temperature, humidity, voltage, current, rotational speed of the machine 10). In the disclosed embodiments, the leakage current 14 is analyzed with respect to the factors, including the temperature gathered over certain operational periods of the machine 10 to determine the condition of the winding insulation. As discussed above, the winding insulation is primarily responsible for blocking the leakage current 14 from exiting the windings 16, but the material of the windings 16 themselves, the housing 20, the rotor, or other components of the machine 10 may also affect the amount of leakage current 14. These factors may allow a first level of leakage current 14 when the machine 10 is brand new, and a different (e.g., higher) level of leakage current 14 at a different time. That is, over the life of the machine 10, the amount of leakage current 14 escaping from the windings 16 may change. In addition to the inherent aspects of the machine 10, the leakage current 14 may be affected by external factors such as temperature, atmospheric conditions, the current flowing through the windings, et cetera. In particular, the temperature of the windings 16 may result in a broad range of leakage current 14. An exemplary relationship of temperature and leakage current is illustrated in FIG. 3. Thus, a more accurate reading of an insulation condition depends upon a more accurate reading of the temperature of the stator 18. However, controlling the temperature of the entire machine 10 may be infeasible.

Figure 2:
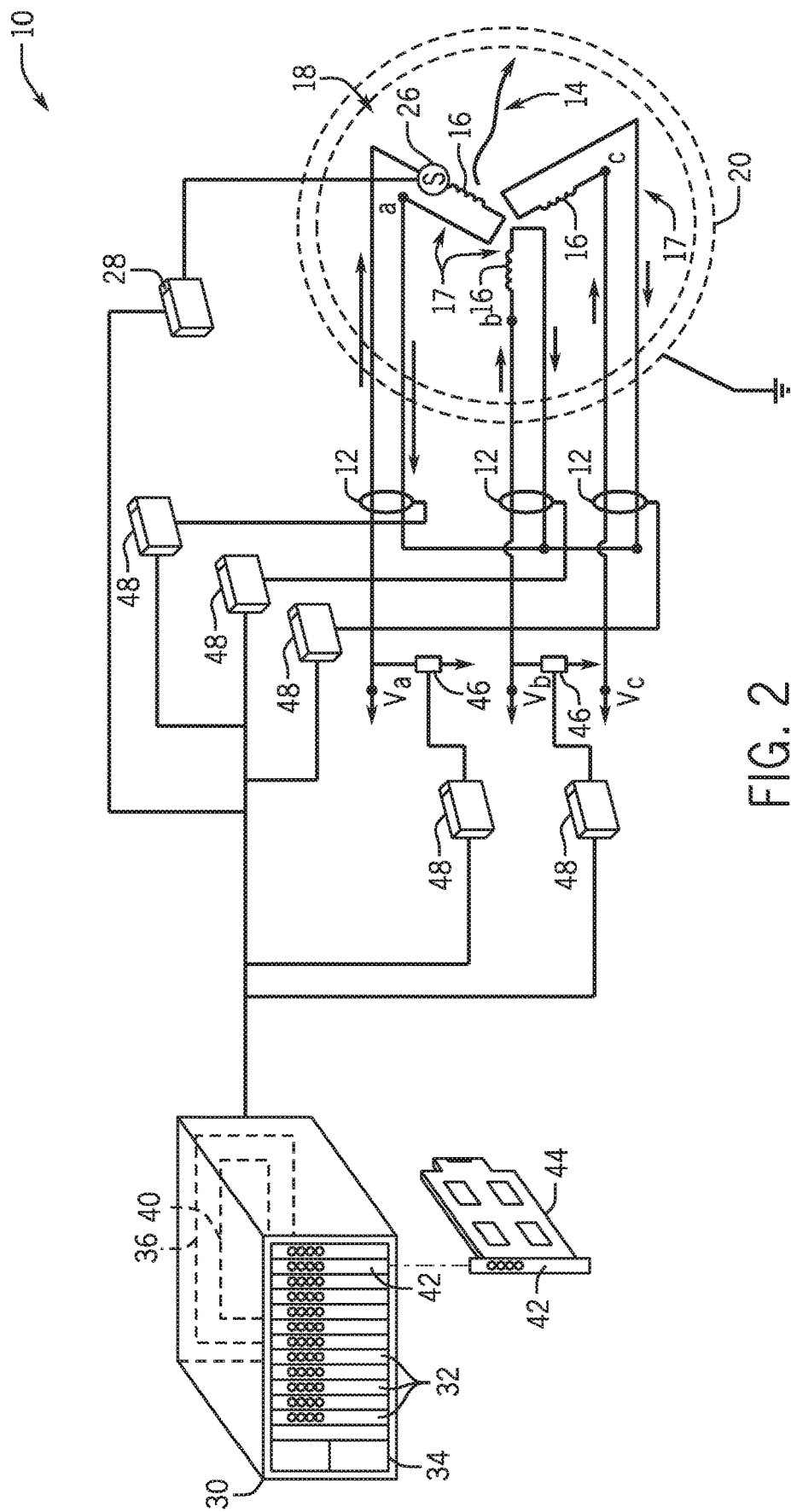
FIG. 2 is a schematic diagram of an embodiment of a rotating machine that has sensors connected to a central monitoring station.

FIG. 2 is a schematic diagram of an embodiment of the rotating machine 10 that has sensors 12 connected to a central monitoring station. The machine 10 includes similar components to those in FIG. 1, accordingly, the similar components are referenced with similar element numbers. Additionally, the machine 10 in FIG. 2 includes one or more temperature sensors 26 that detects the temperature of the windings 16. Each winding 16 of the stator 18 may have one or more of the temperature sensors 26 disposed in various locations in the housing 20, or the temperature sensor 26 may be disposed in only one winding 16. The temperature sensors 26 are communicatively coupled to a temperature collection module 28 which collects the temperature readings from one or more of the temperature sensors 26 and relays the temperature readings to a monitoring and/or protection system 30. The monitoring and/or protection system 30 may include a series of rack mountable devices 32 mounted in a cabinet 34. Rack mountable devices 32 may include, for example: rack mountable cards that provide for data processing, memory, power supplies, vibration and position monitoring, keyphasor monitoring, aero-derivative turbine system condition monitoring, hydro-turbine condition monitoring, wind turbine condition monitoring, reciprocating compressor monitoring, temperature monitoring, pressure monitoring, process variable monitoring, clearance (e.g., distance between rotating and stationary components) monitoring, flow monitoring, actuating relays, pumps, valves, and the like. The devices 32 may be communicatively coupled by using a rack backplane 36. For example, the backplane 36 may include a data communications bus 40 suitable for handling communications between the various cards 32.

Also depicted is an insulation derivation circuit 42 provided as a rack mountable card 44, which may include hot swappable capabilities. That is, the insulation derivation circuit 42 may be replaced with a second insulation derivation circuit 42 without turning off the monitoring and/or protection system 30. Indeed, should the insulation derivation circuit 42 experience undesired conditions, the insulation derivation circuit 42 may be removed and replaced with a second insulation derivation circuit 42 without having to turn off the monitoring and/or protection system 30 and/or the rotating machine 10. During monitoring and/or protection operations, data incoming from the rotating machine 10 may be processed by one or more of the cards 32 and by the insulation derivation circuit 42 to derive a set of measurements, conditions, parameters, alarms, alerts, and so on, useful in providing for the condition of the monitored rotating machine 10. The insulation derivation circuit 42 may also communicate such derivations to external systems.

The monitoring and/or protection system 30 also receives data from one or more high voltage sensors (HVS) 46 and/or high sensitivity current transducers (HSCT) (e.g., sensors 12). The HVS 46 may continuously measure and monitor the line voltage of each winding 16 in the stator 18 at or near certain connections (e.g., $V_a$, $V_b$, $V_c$). The HVS 46 and the HSCT communicate measurements to the monitoring and/or protection system 30 through interface modules 48. The interface modules 48 control the signals picked up by the detection equipment to make it readable by the monitoring and/or protection system 30. The HSCT (e.g., sensors 12) may measure and monitor the differential current or leakage current of each phase, which is sensed and communicated by the sensors 12 and the interface modules 48. In one embodiment, the insulation derivation circuit 42 may calculate insulation conditions and average dissipation factor for each winding 16 of the stator 18 by comparing the phases of the leakage current 14 signals received from the HSCT (e.g., sensors 12) to those of the line voltages received from the HVS 46. While comparison of the signals given by the HSCT (e.g., sensors 12) and the HVS 46 may be accurate for deriving an immediate dissipation factor, the sensitivity of the measurements may be affected by the temperature of the machine 10. Thus, the insulation derivation circuit 42 includes temperature analysis suitable for creating a compensation curve which correlates temperature with the dissipation factor over a broad range of temperatures, as described in more detail with respect to FIG. 3.

FIG. 3 is a graph 50 of an embodiment of a temperature compensation curve 60 that may be used to determine an amount of leakage of the insulation of the windings 16. The insulation derivation circuit 42, as mentioned above, may be programmed to calculate a relationship between temperature and the amount of leakage dissipation from the windings 16. That is, the insulation derivation circuit 42 may create the entirety of the graph 50 or certain portions of the graph 50 based on data received from the sensors 12 and/or physical and statistical models of the insulation in the windings 16. For example, in one embodiment, the graph 50 may be created by sensing insulation leakage current at various operational parameters (e.g., temperature, current, voltage, rotational speed), applying an analysis described in more detail below, and then deriving the compensation curve 60. The graph 50 is shown including an abscissa 52 along which a range of temperatures 54 may be represented, and an ordinate 56, along which a range of the leakage dissipation factor 58 may be represented. Each of the windings 16 of the rotating machine 10 may have a verifiable relationship between the temperature 54 and the leakage dissipation factor 58. While environmental factors may create small changes in a curve, the insulation derivation circuit 42 is able to determine the original (or starting) insulation condition curve 60 based on the readings received from the HVS 46 and the HSCT (e.g., sensors 12). Indeed, the techniques described herein may derive the graph 50 for a variety of motors and/or generators through observations, such as readings from the HVS 46 and/or HSCT (e.g., sensors 12).

Accordingly, a user may communicatively couple the monitoring and/or protection system 30 to the machine 10 and begin machine 10 observations. After a certain initial learning period (e.g., between 1 month and 1 year, 1 week and 1 month, 1 day and 1 week, 1 hour and 1 day), the gathered data may be analyzed to derive the graph 50. The original insulation condition curve 60 is based on the readings received over an initial learning period. The learning period may range between a single startup to many cycles of operation conducted over several hours, days, weeks, and/or months. At some point in time the learning period ends and the insulation derivation circuit 42 stores the curve of the original insulation condition curve 60 that it derived over the learning period. In other embodiments, the graph 50 may also be based on previous experimentation conducted using the material of the insulation of the windings 16. That is, a winding 16 that is constructed with a particular material may have a known compensation curve 60. This may be useful if the sensors 12 are installed as part of an upgrading procedure. That is, as long as the material of the insulation is known, an original insulation condition curve 60 may be determined based on that material.

After the original insulation condition curve 60 is determined (either by derivation during the learning period, or by experimentation on the insulation material), the insulation derivation circuit 42 may derive a second compensation curve 62 that takes into account equipment degradation (e.g., wear and tear). For example, data may be stored over certain operating time of the machine 10 (e.g., between 1 month and 1 year, 1 week and 1 month, 1 day and 1 week, 1 hour and 1 week) and used to derive the second curve 62. Indeed, a plurality (e.g., 3, 4, 5, 6, 7, 8, or more) of different models of the compensation curves 60, 62 may be similarly calculated as the machine 10 ages. Additionally, the second compensation curve 62 may also be a normalized combination of several of the collected models from the monitoring and/or protection system 30. For example, the second compensation curve 62 may be a combination of a first model taken during the first year of operation of the machinery 10, a second model taken during the fifth year of operation of the machine 10, and a third model taken during the tenth year. This may be done due to the changing operating temperatures over the lifetime of the machine 10. As illustrated, the machine 10 may operate with a maximum temperature 64 during the first year of operation. The machine 10 operates at the maximum temperature 64 due to the cooling components such as fans, heat sinks, et cetera prevent further rise in temperature. This may cause the monitoring and/or protection system 30 to create the compensation curves 60, 62 based on detected data 66 and extrapolated data 68. Over time, the cooling components may change so that during the first year of operation the maximum temperature 64 is lower than it is during the fifth year of operation. Thus, in later models, when the maximum temperature 64 is higher, detected data 66 may replace extrapolated data 68 in the compensation curve 60, 62. By combining and normalizing multiple models (detected models and/or experimental models based on the insulation material), the monitoring and/or protection system 30 may achieve a more accurate relationship between temperature 54 and leakage dissipation 58 for a particular machine. Additionally, the curves 60, 62 may be analyzed against each other to derive conditions such as excessive machine 10 degradation, maintenance schedules, and the like. By deriving the curves 60, 62, the techniques described herein provide for enhanced machine 10 monitoring over a wide variety of machine 10 manufacturers and machine 10 types.

Figure 4:
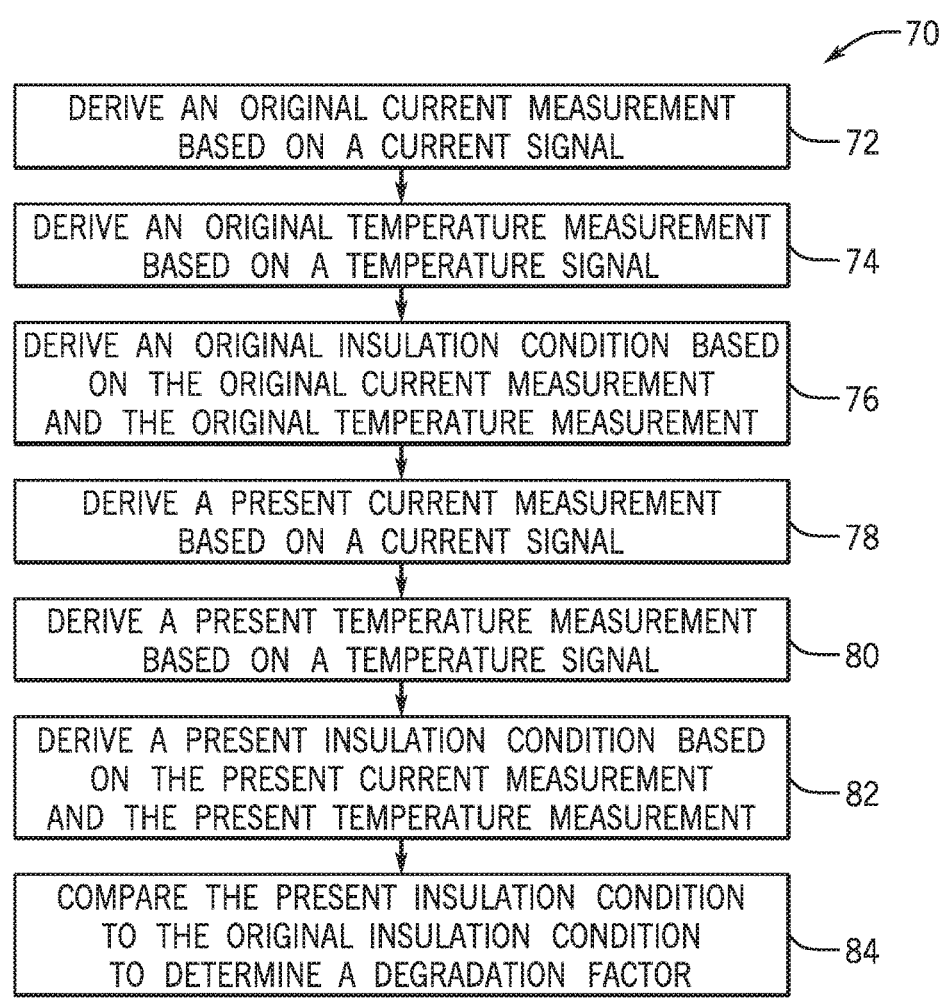
FIG. 4 depicts a flowchart of an embodiment for implementing aspects of the present disclosure in accordance with certain embodiments.

FIG. 4 depicts a flowchart of an embodiment of a process 70 suitable for implementing aspects of the present disclosure in accordance with certain embodiments. To derive the curves 60, 62 depicted in FIG. 3, the insulation derivation circuit 42 may use the process 70 depicted in FIG. 4. The process 70 may be stored as computer instructions in a non-transitory computer readable medium (e.g., memory) of the circuit 42 and executed by the circuit 42, such as by a processor included in the circuit 42. The process 70 begins at block 72 where the insulation derivation circuit 42 derives an original current measurement based on a current signal. The current signal may be a reading provided by the HSCT (e.g., sensors 12) in combination with the HVS 46 as described above. The current measurement is time dependent and thus the insulation derivation circuit 42 is able to store the current signal over a given time period to derive the current measurement. At block 74 the insulation derivation circuit 42 derives an original temperature measurement based on a temperature signal. The temperature signal is received from the temperature collection module 28 as described above. The temperature measurement is also time dependent and therefore the insulation derivation circuit 42, at block 76, is able to derive an original insulation condition based on the original current measurement and the original temperature measurement. The original insulation condition may be derived as the current signal and the temperature signal are received, or may be derived after a full reading has been conducted. In one embodiment, the original insulation condition 60 may be derived by applying a polynomial or exponential fit (e.g., regression analysis) to the data points received from the HVS 46, HSCT (e.g., sensors 12), and the temperature collection module 28. That is, the circuit 42 may collect data points and apply a linear (or non-linear) regression fitting to the points to derive the curves 60, 62. The insulation derivation circuit 42 may also include a neural network, a genetic algorithm, an expert system, and/or data mining techniques (e.g., clustering techniques such as k-means clustering) whereby the insulation derivation circuit 42 learns over time the relationship between temperature and dissipation factor for any of the windings 16.

In further embodiments of the method 70 of FIG. 4, the insulation derivation circuit 42, at block 78, derives a present current measurement based on a current signal. The current signal is provided by the HVS 46 and the HSCT (e.g., sensors 12), as with the original current signal. The insulation derivation circuit 42 also derives, at block 80, a present temperature measurement based on a temperature signal received from the temperature collection module 28. The insulation derivation circuit 42 then derives, at block 82, a present insulation condition based on the present current measurement and the present temperature measurement derived at blocks 78 and 80. The insulation derivation circuit 42 then compares, at block 84, the present insulation condition to the original insulation condition to determine a degradation factor. The degradation factor is used to determine, among other things, the service schedule for the windings 16 and/or the stator. Further, the monitoring and/or protection system 30 may more accurately account for the current leakage 14 in a variety of rotating machines 10, including rotating machines 10 that may be provided by different manufacturers.

Technical effects of the invention include systems and methods for determining a degradation factor for a winding 16 in a rotating machine 10. An insulation derivation circuit 42 receives readings from temperature collections modules 28, HVS 46, and HSCT (e.g., sensors 12). The readings are collected from sensors 12, 26 that monitor operation of the rotating machine 10. From the readings, the insulation derivation circuit 42 is able to determine an insulation condition. The insulation condition may be an original insulation condition or a present insulation condition. In some embodiments the present insulation condition is compared to an original insulation condition that is also derived by the insulation derivation circuit 42. In other embodiments, the original insulation condition may be based on other pre-calculated curves. Comparing the present insulation condition to the original insulation condition yields a degradation factor.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A non-transitory computer readable medium comprising instructions configured to:
   derive, via a monitoring and/or protection system comprising an insulation derivation circuit, an original current measurement based on a signal from a current sensor sensing a current traversing a stator winding of a motor, a generator, or a combination thereof by comparing a phase of the current sensed by the current sensor with a phase of a voltage associated with the current and sensed via a line voltage sensor;
   derive, via the monitoring and/or protection system, an original temperature measurement based on a temperature signal from a temperature sensor disposed in a stator comprising the stator winding and configured to sense a temperature when the stator is energized; and
   derive, via the monitoring and/or protection system, an original insulation condition based on the original current measurement and the original temperature measurement.

2. The non-transitory computer readable medium of claim 1, wherein the instructions are configured to:
   derive a present current measurement based on a second signal from the current sensor sensing a current traversing the stator winding of the motor, the generator, or the combination thereof;
   derive a present temperature measurement based on a second temperature signal from the temperature sensor; and
   derive a present insulation condition based on the present current measurement and the present temperature measurement; and
   compare the present insulation condition to the original insulation condition to determine a degradation factor.

3. The non-transitory computer readable medium of claim 2, wherein comparing the present insulation condition to the original insulation condition includes using a temperature compensation curve.

4. The non-transitory computer readable medium of claim 1, wherein the instructions are configured to derive the original insulation condition using a neural network, a genetic algorithm, an expert system, or a combination thereof.

5. The non-transitory computer readable medium of claim 1, wherein the instructions are configured to derive the original insulation condition using a polynomial function fit curve wherein the function is fit to a curve on a graph with a dissipation factor as an ordinate and a temperature as an abscissa.

6. The non-transitory computer readable medium of claim 1, wherein the instructions are embodied on a rack-mountable card.

7. The non-transitory computer readable medium of claim 1, wherein the instructions are configured to transfer the original insulation condition to an external storage location.

8. A method, comprising:
deriving, via a monitoring and/or protection system comprising an insulation derivation circuit, an original current measurement based on a signal from a current sensor sensing a current traversing a stator winding of a motor, a generator, or a combination thereof by comparing a phase of the current sensed by the current sensor with a phase of a voltage associated with the current and sensed via a line voltage sensor;
deriving, via the monitoring and/or protection system, an original temperature measurement based on a temperature signal from a temperature sensor disposed in a stator comprising the stator winding and configured to sense a temperature when the stator is energized; and
deriving, via the monitoring and/or protection system, an original insulation condition based on the original current measurement and the original temperature measurement.

9. The method of claim 8, comprising:
deriving a present current measurement based on a second signal from the current sensor sensing a current traversing of the stator winding of the motor, the generator, or the combination thereof;
deriving a present temperature measurement based on a second temperature signal from the temperature sensor; and
deriving a present insulation condition based on the present current measurement and the present temperature measurement; and
comparing the present insulation condition to the original insulation condition to determine a degradation factor.

10. The method of claim 8, wherein deriving an original current measurement, deriving an original temperature measurement, or any combination thereof comprises deriving for a learning period, wherein the learning period begins at a startup of the motor, the generator, or combination thereof within the stator, and ends after a user-defined time period.

11. A system, comprising:
a current sensor configured to sense a current traversing a stator winding of a motor, a generator, or a combination thereof;
a temperature sensor disposed in a stator comprising the stator winding and configured to sense a temperature when the stator is energized; and
an insulation derivation circuit comprising a processor communicatively coupled to the current sensor and the temperature sensor, and wherein the processor is configured to:
derive an original current measurement based on a signal from the current sensor by comparing a phase of the current sensed by the current sensor with a phase of a voltage associated with the current and sensed via a line voltage sensor;
derive an original temperature measurement based on a temperature signal from the temperature sensor; and
derive an original insulation condition of an insulation of the stator winding based on the original current measurement and the original temperature measurement.

12. The system of claim 11, wherein the processor is configured to:
derive a present current measurement based on a second signal from the current sensor sensing a current traversing the first phase of the stator winding of the motor, the generator, or the combination thereof;
derive a present temperature measurement based on a second temperature signal from the temperature sensor; and
derive a present insulation condition for the insulation of the first phase of the stator winding based on the present current measurement and the present temperature measurement; and
compare the present insulation condition to the original insulation condition to determine a degradation factor for the insulation of the first phase of the stator winding.

13. The system of claim 12, wherein the processor is configured to compare the present insulation condition to the original insulation condition using a temperature compensation curve.

14. The system of claim 11, wherein the processor is configured to derive the original insulation condition using a neural network, a genetic algorithm, an expert system, or a combination thereof.

15. The system of claim 11, wherein the processor is configured to derive the original insulation condition using a polynomial function fit curve wherein the function is fit to a curve on a graph with a dissipation factor as an ordinate and a temperature as an abscissa.

16. The system of claim 11, wherein the insulation derivation circuit is configured to transfer the original insulation condition derived by the processor to an external storage location.

17. The system of claim 11, comprising:
a second current sensor configured to sense a second current traversing a second stator winding of the motor, the generator, or the combination thereof and generate a second signal based upon the sensed second current; and
a second temperature sensor disposed in the stator comprising the second stator winding and configured to sense a second temperature when the stator is energized and generate a second temperature signal based upon the sensed second temperature, wherein the processor of the insulation derivation circuit is communicatively coupled to the second current sensor and the second temperature sensor.

18. The system of claim 17, wherein the processor is configured to:
derive a second original current measurement based on the second signal from the second current sensor;
derive a second original temperature measurement based on the second temperature signal from the second temperature sensor; and derive a second original insulation condition for an insulation of the second stator winding based on the second original current measurement and the second original temperature measurement.

19. The system of claim 11, wherein the current sensor comprises a high sensitivity current transducer (HSCT), a high voltage sensor (HVS), or a combination thereof.

* * * * *